(12) United States Patent
Trevelyan et al.

(10) Patent No.: US 7,751,135 B2
(45) Date of Patent: Jul. 6, 2010

(54) PIEZOELECTRIC MOVEMENT OF A LENS

(75) Inventors: Philip Trevelyan, Surrey (GB); Tim Mellow, Surrey (GB)

(73) Assignee: Nokia Corporation, Espoo (FI)

( * ) Notice: Subject to any disclaimer, the term of this patent is extended or adjusted under 35 U.S.C. 154(b) by 12 days.

(21) Appl. No.: 11/999,254

(22) Filed: Dec. 3, 2007

(65) Prior Publication Data

US 2009/0141372 A1 Jun. 4, 2009

(51) Int. Cl.
*G02B 7/02* (2006.01)
(52) U.S. Cl. .......................... 359/824; 359/813
(58) Field of Classification Search ............... 359/824
See application file for complete search history.

(56) References Cited

U.S. PATENT DOCUMENTS

| | | | |
|---|---|---|---|
| 4,303,324 A | 12/1981 | Marcus | |
| 4,601,539 A * | 7/1986 | Watanabe | 359/824 |
| 2005/0259335 A1 * | 11/2005 | Nishioka | 359/726 |
| 2006/0119218 A1 * | 6/2006 | Doshida et al. | 310/323.01 |

FOREIGN PATENT DOCUMENTS

| | | |
|---|---|---|
| EP | 0154473 | 9/1985 |
| GB | 2434214 | 7/2007 |
| WO | WO 2006/119218 | 8/2006 |

\* cited by examiner

*Primary Examiner*—Jordan M. Schwartz
*Assistant Examiner*—James C Jones
(74) *Attorney, Agent, or Firm*—Alfred A. Fressola; Ware, Fressola, Van Der Sluys & Adolphson, LLP

(57) ABSTRACT

The invention relates to an apparatus, comprising a lens and a piezoelectric element. The piezoelectric element is configured to bend in response to a voltage applied thereto. The lens and the piezoelectric element are arranged so that the bending causes at least a portion of the lens to move in at least one movement direction. The invention further relates to an according method and computer-readable medium.

26 Claims, 2 Drawing Sheets

PIEZOELECTRIC MOVEMENT OF A LENS

TECHNICAL FIELD

This invention relates to the movement of lenses in optical devices such as for instance cameras.

BACKGROUND OF THE INVENTION

Movement of lenses is for instance required in Auto-Focus (AF) cameras, where lenses have to be moved along the optical axis to achieve focus. Known AF drive mechanisms for AF cameras have used either electromagnetic (e.g. voice coil technology), rotary methods (e.g. stepper motors) or piezoelectric motors (e.g. vibration drives) to move the lens and achieve focus. However, stepper motors are generally complex, expensive and quite large. Voice coils require large currents in the amount of 50-100 mA, and need continuous power to maintain lens focus. Piezoelectric motors are difficult to control, which leads to an inaccurate lens position in all axes. Furthermore, such motors can be temperature-dependent in their speed of operation.

SUMMARY OF THE INVENTION

An apparatus is disclosed, comprising a lens and a piezoelectric element configured to bend in response to a voltage applied thereto, wherein the lens and the piezoelectric element are arranged so that the bending causes at least a portion of the lens to move in at least one movement direction. The apparatus may for instance be embodied as a module. The apparatus may for instance be comprised in a device that is capable of capturing images. The apparatus may for instance be comprised in a camera, such as a digital camera, or a mobile phone.

Further, a method is disclosed, comprising applying a voltage to a piezoelectric element to cause the piezoelectric element to bend, wherein the piezoelectric element and a lens are arranged so that the bending causes at least a portion of the lens to move in at least one movement direction.

Further, a computer-readable medium having a computer program stored thereon is disclosed, the computer program comprising instructions operable to cause a processor to apply a voltage to a piezoelectric element to cause the piezoelectric element to bend, wherein the piezoelectric element and a lens are arranged so that the bending causes at least a portion of the lens to move in at least one movement direction. The computer-readable medium may be any medium that is capable of storing digital data in electric, magnetic, electromagnetic or optic form. The medium may be fixedly installed in a device or may be a removable medium.

Further, a computer program is disclosed, comprising instructions operable to cause a processor to apply a voltage to a piezoelectric element to cause the piezoelectric element to bend, wherein the piezoelectric element and a lens are arranged so that the bending causes at least a portion of the lens to move in at least one movement direction.

The lens may be any type of lens, such as for instance a biconvex or planoconvex lens, to name but a few examples. The lens may be made of one piece, or may be composed of two or more portions. The lens may for instance be a focus lens in a device that is capable of capturing images in analog or digital format.

The piezoelectric element comprises piezoelectric material, i.e. material that produces electricity when stress is applied to it, and that produces stress and/or strain when a voltage is applied to it. Voltage may for instance be applied to the piezoelectric element via conductive coatings. The piezoelectric element may for instance comprise Polyvinylidene Difluoride (PVDF). The piezoelectric element is configured to bend in response to a voltage applied thereto. This may for instance be achieved by designing the piezoelectric element as a unimorph or bimorph, i.e. a cantilever-like structure with either two active layers (bimorph) or one active and one inactive layer (unimorph).

The lens and the piezoelectric element are arranged in a way that the bending causes at least a portion of the lens to move in at least one movement direction. The at least one movement direction may for instance be the optical axis of the lens. The piezoelectric element may for instance be arranged to be in contact with the lens or a part thereof, so that a bending of the piezoelectric element moves the lens. The piezoelectric element may for instance be located above, below or within the lens. The piezoelectric element and the lens may for instance interact with return elements (e.g. springs or one or more further piezoelectric elements) that exert a force on the lens (or a portion thereof) in a direction that is opposite to the direction into which the lens (or the portion thereof) is moved by the bending.

The piezoelectric element may comprise two layers, and a bending direction of the piezoelectric element may be substantially perpendicular to a contact area of both layers. For instance, the piezoelectric element may be a bimorph (two active layers) or a unimorph (one active and one inactive layer). If the layers are discs, the bending direction is parallel to the normal of the discs. The same holds if the layers are washer shaped discs with a center hole.

The piezoelectric element and the lens may be arranged so that the at least one movement direction is substantially parallel to the bending direction of the piezoelectric element.

The piezoelectric element may be a substantially plane element that is configured to bend maximally at its center. This may for instance be achieved by supporting the piezoelectric element at its rim.

The piezoelectric element and the lens may then be arranged in a way that the optical axis of the lens substantially goes through the center of the piezoelectric element.

The piezoelectric element may for instance be sandwiched between two portions of the lens. This may allow producing an even force for an accurate movement of the lens (or of portions thereof) and/or may contribute to reduce potential visual distortions since it becomes possible to place the piezoelectric element closer to an image sensor. The two portions of the lens and the piezoelectric element may then be contained in an at least partially laterally surrounding frame structure and may be supported to allow movement of at least one portion of the lens in the direction of the optical axis of the lens. The rim of the piezoelectric element may for instance be attached to the frame. A returning force for the lens (or a portion thereof) may for instance be generated by a spring or by a further piezoelectric element.

For instance, the two portions of the lens and the piezoelectric element may be contained in the frame structure in a way that one portion of the lens is fixed and the other portion is moveable. For instance, a first (fixed) portion of the lens may held between a stopping means, for instance a compliance ring, and the piezoelectric element, and the other (movable) portion of the lens may be held between the piezoelectric element and a return element (e.g. a spring) so that this portion can move when the piezoelectric element bends. Therein, the piezoelectric element may be fixed at its rim or not. Equally well, the piezoelectric element may be arranged above or below the lens. The lens may then be made of one piece.

The piezoelectric element may at least partially be arranged in an optical path of an apparatus in which the lens and the piezoelectric element are comprised. Light that traverses the lens then at least partially also traverses the piezoelectric element.

The piezoelectric element may at least partially be transparent. For instance, only that region of the piezoelectric element that is arranged in the optical path may be required to be transparent. The piezoelectric element may for instance be made of Polyvinylidene Difluoride (PVDL), which is also known as Kynar.

The piezoelectric element may have at least partially transparent conductive coatings. For instance, only that region of the piezoelectric element that is arranged in the optical path may be required to have transparent coatings. The transparent coatings may for instance be made of indium tin oxide.

The piezoelectric element may comprise at least one aperture or recess to at least partially avoid blocking of the optical path of the apparatus. Deploying a piezoelectric element with an aperture (e.g. a hole) or recess to allow at least partially unblocked passage of the light may allow using piezoelectric material of reduced transparency (e.g. non-transparent piezoelectric material). Such material may have improved piezoelectric characteristics as compared to the transparent piezoelectric material. Furthermore, also conductive coatings with less or no transparency may then be used for the piezoelectric element. The aperture or recess may be formed in only a part of the piezoelectric element. For instance, if the piezoelectric element comprises several parts (e.g. layers) of piezoelectric and/or non-piezoelectric material, only some of the parts (e.g. layers) may have an aperture of recess formed therein. For instance, only the piezoelectric material may have an aperture or recess, and a coating of the piezoelectric element may not have an aperture or recess.

The piezoelectric element may comprise a bimorph. The bimorph may comprise two active piezoelectric layers (e.g. polymer layers made of PVDF) that are furnished with conductive coatings. Applying a high voltage across the conductive coatings may then cause one layer to elongate while the other layer contracts thus producing a bending moment within the piezoelectric element. The bimorph may for instance be disc-shaped.

An apparatus comprising the lens and the piezoelectric element may further comprise a return element that is configured to exert a return force on at least the portion of the lens that is moved in the at least one movement direction. The return element may for instance be a spring, or a further piezoelectric element, to name but a few examples. If a piezoelectric element is used to exert the return force, both piezoelectric elements may work in a push-pull mode to allow accurate positioning of the lens. One piezoelectric element then may be used to move the lens (or a portion thereof) in one direction, and the other piezoelectric element may be used to move the lens (or a portion thereof) in the opposite direction. This kind of lens positioning may also be more efficient and/or also less affected by gravity.

A position of at least the portion of the lens that is moved may be determined by measuring a voltage across the piezoelectric element.

An apparatus comprising the lens and the piezoelectric element may further comprise a step-up, switch-mode supply configured to provide a high voltage to the piezoelectric element.

These and other aspects of the invention will be apparent from and elucidated with reference to the detailed description presented hereinafter. The features of the present invention and of its exemplary embodiments as presented above are understood to be disclosed also in all possible combinations with each other.

DETAILED DESCRIPTION

Figure 1:
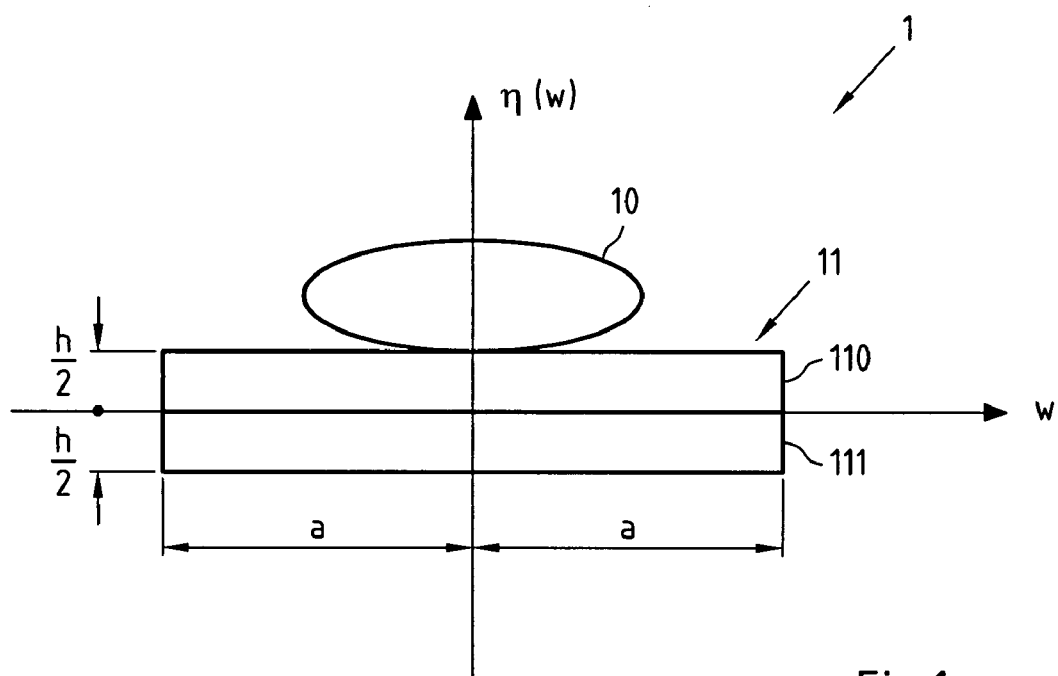
FIG. 1: A cross-sectional view of an exemplary embodiment of an apparatus according to the present invention with an overlaid actuation diagram.

FIG. 1 is a cross-sectional view of an exemplary embodiment of an apparatus 1 according to the present invention with an overlaid actuation diagram. Apparatus 1 may for instance be deployed (for instance in the form of a module) in a device that is capable of capturing images, such as for instance a camera or a mobile phone, but may equally well be deployed in other devices that require movement of lenses.

The bimorph piezoelectric element 11 in apparatus 1 comprises two active layers 110, 111 of piezoelectric material (for instance a polymer such as Polyvinylidene Difluoride (PVDF), also known as Kynar™) and is exemplarily shaped as a disc of radius a. The two active layers 110 and 111 may for instance be glued together. Each piezoelectric layer 110, 111 has a height of h/2. The piezoelectric element 11 is furnished with conductive coatings. These coatings may for instance be applied on the top and the bottom of each disc-shaped layer 110 and 111. The top and bottom coating of each respective layer 110 and 111 may for instance be connected to a voltage source, wherein a polarity of the voltage source connected to the coatings of layer 110 may for instance be adverse to the polarity of the voltage source connected to the coatings of layer 111. For instance, the top coating of layer 110 and the bottom coating of layer 111 may be connected to negative terminals, whereas the bottom coating of layer 110 and the top coating of layer 111 may be connected to positive terminals.

The piezoelectric element 1 is arranged below a lens 10, so that, when the piezoelectric element 11 bends in a direction indicated by the deflection axis, the lens is moved along its optical axis. Such vertical movement of the piezoelectric element 11 can be achieved by varying a high voltage across the conductive coatings and this will cause the lens 10 to move as well (for instance, a distance of ~0.35 mm may be required for Auto-Focus (AF) applications). The electric fields within the double layers 110, 111 cause one layer to elongate, while the other contracts thus producing a bending moment within the piezoelectric material.

Since the piezoelectric element 11 is arranged below the lens 10 and thus is positioned in the optical path, it is advantageous that the piezoelectric element 11 is made of transparent material (e.g. PVDF), and that also the conductive coating is transparent, for instance made of indium tin oxide. Alternatively, the piezoelectric element 11 and/or the conductive coatings may comprise an aperture or recess, such as for instance a centered hole, to at least partially avoid blocking of the optical path. This may allow to also use piezoelectric material and/or coatings of less or no transparency.

If the actuator disk 11 of FIG. 1 is simply supported at its rim, there exists a vertical deflection.

At the centre of the disc, there exists a maximum deflection.

The piezoelectric actuator material can be PVDF with specific parameters, thickness, radius, maximum deflection, Poisson's ratio, and piezoelectric strain coeff.

With these parameters, there exists a voltage required to achieve a maximum deflection at a centre.

Although this voltage is comparably high, it may not require much current to drive the lens and so would be easily generated using a step-up, switch-mode supply (for instance in a similar manner to Xenon capacitor charging circuits which operate at ~320 volts). This kind of voltage regulator may produce a higher voltage than the battery and may be regulated efficiently across a range of voltages which could be used to control the lens position.

A returning force may for instance be exerted on the lens by means of a spring.

Figure 2:
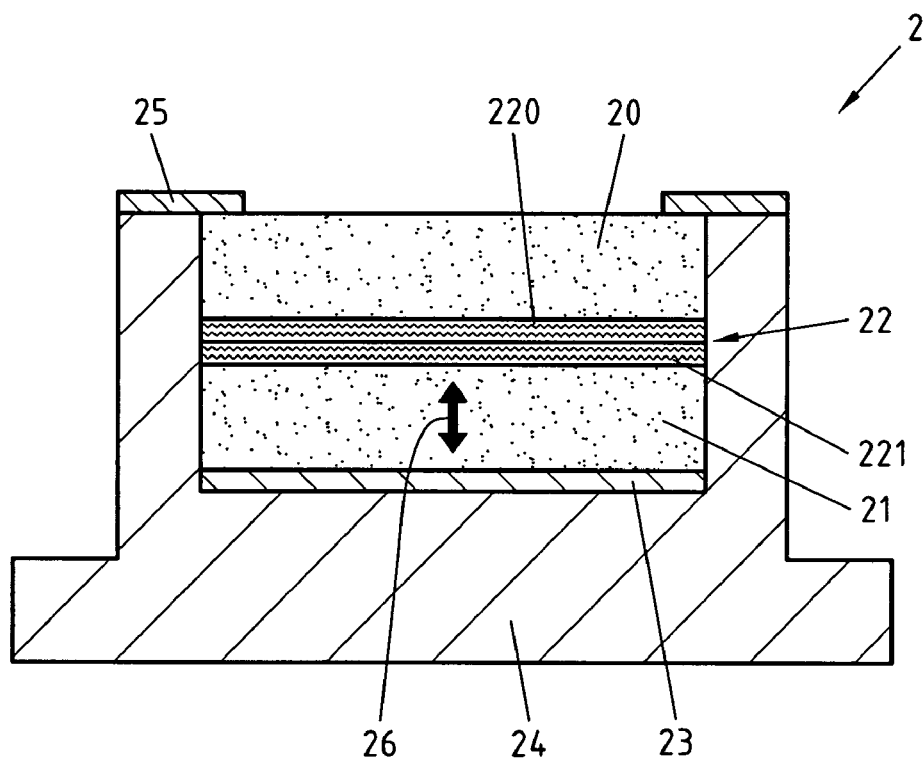
FIG. 2: a cross-sectional view of a further exemplary embodiment of an apparatus according to the present invention.

FIG. 2 shows a cross-sectional view of a further exemplary embodiment of an apparatus 2 according to the present invention. In this embodiment, similar to the embodiment of FIG. 1, piezoelectric bimorph principles are used to move the lens over its focal range. However, in contrast to the embodiment of FIG. 1, a transparent piezoelectric polymer disc 22 (for instance made of PVDF) comprising two piezoelectric layers 220 and 221 (which may for instance be glued together) is placed between two portions 20, 21 of a lens, so that the piezoelectric disc 22 is sandwiched between the two lens portions 20 and 21. Sandwiching the piezoelectric disc 22 between the two lens portions 20 and 21 may allow producing an even force for an accurate movement of the lens. Furthermore, visual distortions caused by the piezoelectric disc 22 may be reduced when the piezoelectric element 22 is located close to the image sensor.

Therein, the two portions 20, 21 of the lens are only depicted schematically, i.e. all types of curvatures of the surface of the lens portions 20, 21 are possible. The lens portions 20, 21 thus may for instance be embodied as a biconvex or planoconvex lens, to name but a few possibilities.

The stack formed by the two lens portions 20, 21, the piezoelectric disc 22 and a lens spring 23 for exerting a return force are arranged in a frame 24 and secured by a compliance ring 25.

Therein, the rim of the piezoelectric disc 22 may be fixedly attached to frame 24, but this is not necessarily required.

The piezoelectric element 22 is furnished with transparent conductive coatings, such as (but not limited to) indium tin oxide. These coatings may for instance be applied on the top and the bottom of each disc-shaped layer 220 and 221. The top and bottom coating of each respective layer 220 and 221 may for instance be connected to a voltage source, wherein a polarity of the voltage source connected to the coatings of layer 220 may for instance be adverse to the polarity of the voltage source connected to the coatings of layer 221. For instance, the top coating of layer 220 and the bottom coating of layer 221 may be connected to negative terminals, whereas the bottom coating of layer 220 and the top coating of layer 221 may be connected to positive terminals.

The piezoelectric element 22 and/or the conductive coatings may comprise an aperture or recess, such as for instance a centered hole, to at least partially avoid blocking of the optical path. This may allow to also use piezoelectric material and/or coatings of less or no transparency.

In the stack of elements 20-23, the lens portion 20 forms a fixed lens portion, since it is held between the compliance ring and the piezoelectric element 22 (and is laterally supported by the frame 24. The lens portion 21 is held between the piezoelectric element 22 and lens spring 23 (and is also laterally supported by frame 24) and is movable, as indicated by arrow 26. When voltage of a specific polarity is applied to piezoelectric element 22 via the conductive coatings, the piezoelectric material in disc 22 becomes stressed, bends downwards (for instance in the shape of a dome due to the maximum bending in the centre of the disc) and thus moves lens portion 21 downwards until equilibrium between the bending force of piezoelectric element 22 (directed downwards) and the returning force of spring element 23 (directed upwards) is achieved. When the voltage is turned off, the returning force of spring element 23 causes the lens portion 21 to move back to the position illustrated in FIG. 2.

The returning force could be achieved in a couple of ways, either using a spring (as for instance used in voice coil actuators), or with an extra disc (such as a PVDF disc), to name but a few possibilities. In the description of FIG. 2, exemplarily the use of a spring element 23 was assumed.

Figure 3:
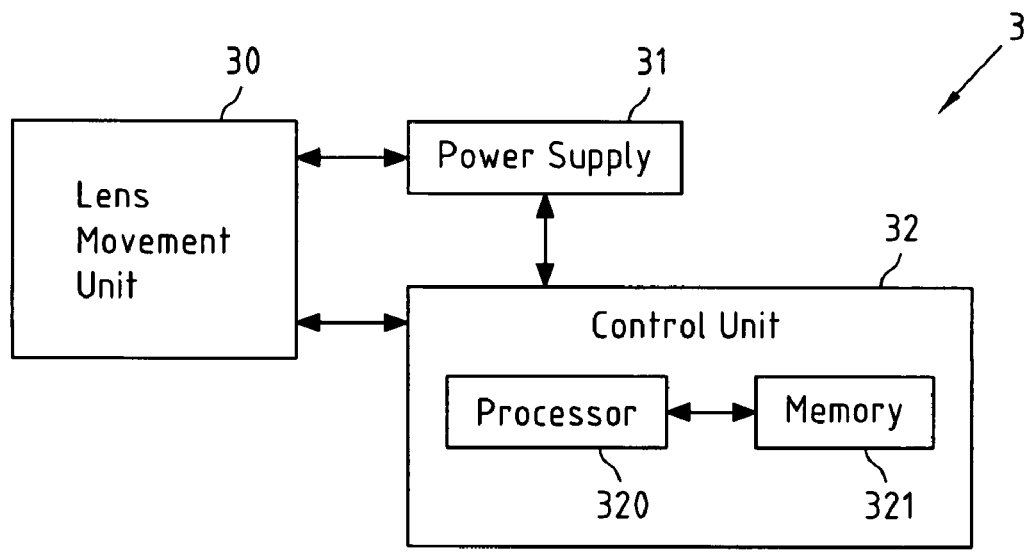
FIG. 3: a block diagram of an exemplary embodiment of an apparatus according to the present invention.

FIG. 3 shows a block diagram of an exemplary embodiment of an apparatus 3 according to the present invention. This apparatus may for instance be embodied as a module, for instance an AF module, and may be used in a device that is capable of capturing images, such as for instance a camera or a mobile phone. Apparatus 3 comprises a lens movement unit 30, which may for instance be embodied as explained with reference to the embodiments of FIGS. 1 and 2 above, a power supply 31, which may for instance be embodied as switching-mode power supply for generating high voltages, and a control unit 32, which controls application of voltage to the piezoelectric elements of lens movement unit 30 in order to achieve that the lens is moved to a specific focus position. Control unit 32 furthermore may be used to control the correct position of the lens, for instance by reading out a voltage of a further piezoelectric element of lens movement unit 30. Control unit 32 comprises a processor 320 and a memory 321, wherein the memory represents a computer-readable medium that stores program code that is executed by processor 320.

The exemplary embodiments of the present invention presented above allow for an efficient, simple and reliable movement of lenses (or parts thereof) at comparably low costs.

In these embodiments, further improvements in lens control could be obtained with the addition of another piezoelectric motor (for instance beneath the lens 10 in FIG. 1 or as a replacement of spring 23 in FIG. 2) to act in a 'push-pull' mode. Depending on polarity of the high voltage across the layers, they will be attracted or repelled by each other. The additional piezoelectric motor (which may for instance be embodied like piezoelectric element 11 of FIG. 1 or 22 of FIG. 2) may for instance be driven with a drive signal that is inverse to the drive signal used for the piezoelectric element 11 (FIG. 1) and 22 (FIG. 2). In contrast to the use of a spring for exerting the return force, the deployment of a second piezoelectric motor allows for a more efficient and more accurate lens positioning that is also less affected by gravity.

Furthermore, the position of the lens/lens portion(s) may be accurately determined by measuring the voltage across the piezoelectric element (e.g. element 11 in FIG. 1 and element 22 in FIG. 2). Such measurement may also be performed when two piezoelectric elements in 'push-pull' mode are used. Therein, it is advantageous that potentially small amounts of non-linearity at the start of the lens movement when using a spring are accounted for, for instance by considering such non-linearities in the focus algorithm.

The polymer of the piezoelectric element may cause distortion of the captured image unless corrected by the lens.

Instead or in addition to such correction by the lens, such distortions can be mitigated by placing the material close to the camera's silicon sensor.

Figure 4:
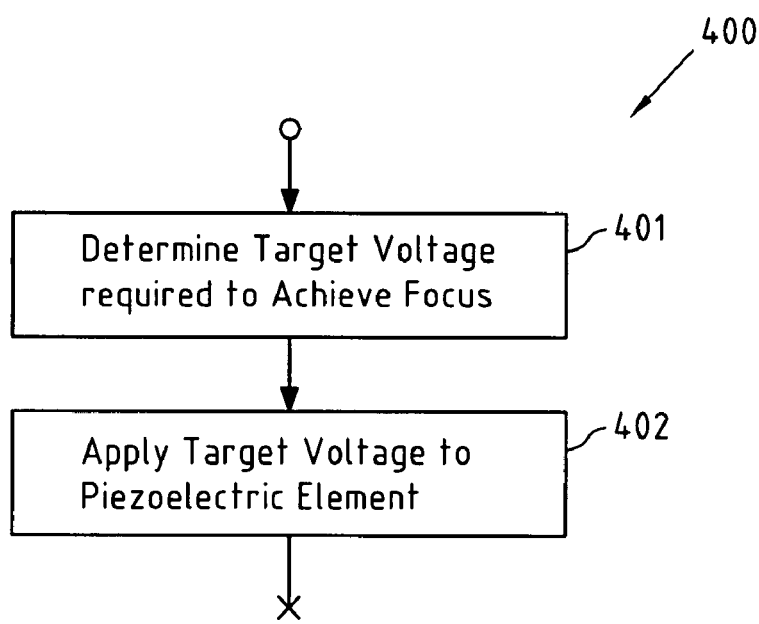
FIG. 4: an exemplary flowchart of a method according to the present invention.

FIG. 4 is an exemplary flowchart 400 of a method according to the present invention. In a first step 401, a target voltage required to achieve focus is determined, for instance by a processor of a device in which a piezoelectric element according to the present invention is deployed to move a lens. In a second step 402, the determined target voltage is applied to a piezoelectric element, for instance the piezoelectric element 11 of FIG. 1 or 22 of FIG. 2. This causes the piezoelectric element to bend and thus to move the lens it is associated with to achieve focus.

The invention has been described above by means of exemplary embodiments. It should be noted that there are alternative ways and variations which are obvious to a person skilled in the art and can be implemented without deviating from the scope and spirit of the appended claims.

Furthermore, it is readily clear for a skilled person that the flowchart steps presented in the above description may at least partially be implemented in electronic hardware and/or computer software, wherein it depends on the functionality of the flowchart step and on design constraints imposed on the respective devices to which degree a flowchart step is implemented in hardware or software. The presented flowchart steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

What is claimed is:

1. An apparatus, comprising:
   a first lens,
   a second lens, and
   a piezoelectric element configured to bend in response to a voltage applied thereto, wherein said piezoelectric element is sandwiched between said first lens and said second lens and wherein said first lens, said second lens, and said piezoelectric element are arranged so that said bending causes at least one of said first lens and said second lens to move in at least one movement direction, thus causing movement of at least one of said first lens and said second lens relative to a respective other lens of said first lens and said second lens.

2. The apparatus of claim 1, wherein said piezoelectric element comprises two layers, and wherein a bending direction of said piezoelectric element is substantially perpendicular to a contact area of both layers.

3. The apparatus of claim 2, wherein said piezoelectric element comprises a bimorph.

4. The apparatus of claim 2, wherein said piezoelectric element, said first lens, and said second lens are arranged so that said at least one movement direction is substantially parallel to said bending direction of said piezoelectric element.

5. The apparatus of claim 4, wherein said piezoelectric element is a substantially plane element that is configured to bend maximally at its center.

6. The apparatus of claim 5, wherein said piezoelectric element, said first lens, and said second lens are arranged in a way so that the optical axis of said first lens and said second lens substantially goes through said center of said piezoelectric element.

7. The apparatus of claim 1, wherein said first lens, said second lens, and said piezoelectric element are contained in an at least partially laterally surrounding frame structure and are supported to allow movement of at least one of said first lens and said second lens in the direction of the optical axis of said first lens and said second lens.

8. The apparatus of claim 1, wherein said piezoelectric element is at least partially arranged in an optical path of said apparatus.

9. The apparatus of claim 8, wherein said piezoelectric element is at least partially transparent.

10. The apparatus of claim 9, wherein said piezoelectric element is made of Polyvinylidene Difluoride.

11. The apparatus of claim 9, wherein said piezoelectric element has at least partially transparent conductive coatings.

12. The apparatus of claim 8, wherein said piezoelectric element comprises at least one aperture or recess to at least partially avoid blocking of said optical path of said apparatus.

13. The apparatus of claim 1, further comprising a return element that is configured to exert a return force on at least said at least one of said first lens and said second lens that is caused to move in said at least one movement direction by said bending of said piezoelectric element if said at least one of said first lens and said second lens is moved in said at least one movement direction.

14. The apparatus of claim 13, wherein said return element is a spring.

15. The apparatus of claim 13, wherein said return element is a piezoelectric element.

16. The apparatus of claim 15, wherein said piezoelectric element and said return element work in a push-pull mode.

17. The apparatus of claim 1, wherein a position of at least said at least one of said first lens and said second lens that is caused to move in said at least one movement direction by said bending of said piezoelectric element is determined by measuring a voltage across said piezoelectric element.

18. The apparatus of claim 1, further comprising a step-up, switch-mode supply configured to provide a high voltage to said piezoelectric element.

19. The apparatus of claim 1, wherein said apparatus is embodied as a module.

20. The apparatus of claim 1, wherein said apparatus is comprised in a device that is capable of capturing images.

21. The apparatus of claim 1, wherein said apparatus is comprised in a camera.

22. The apparatus of claim 1, wherein said apparatus is comprised in a mobile phone.

23. A method, comprising:
   applying a voltage to a piezoelectric element to cause said piezoelectric element to bend, wherein said piezoelectric element is sandwiched between a first lens and a second lens and wherein said piezoelectric element, said first lens, and said second lens are arranged so that said bending causes at least one of said first lens and said second lens to move in at least one movement direction, thus causing movement of at least one of said first lens and said second lens relative to the respective other lens of said first lens and said second lens.

24. The method of claim 23, wherein said piezoelectric element is extended in at least one direction, and wherein a bending direction of said piezoelectric element is substantially perpendicular to said at least one direction in which said piezoelectric element is extended.

25. A computer-readable medium having a computer program stored thereon, the computer program comprising:
   instructions operable to cause a processor to apply a voltage to a piezoelectric element to cause said piezoelectric element to bend, wherein said piezoelectric element is sandwiched between a first lens and a second lens and wherein said piezoelectric element, said first lens and said second lens are arranged so that said bending causes at least one of said first lens and said second lens to move in at least one movement direction, thus causing movement of at least one of said first lens and said second lens relative to the respective other lens of said first lens and said second lens.

26. The computer-readable medium of claim 25, wherein said piezoelectric element is extended in at least one direction, and wherein a bending direction of said piezoelectric element is substantially perpendicular to said at least one direction in which said piezoelectric element is extended.

* * * * *